United States Patent [19]

Saito

[11] Patent Number: 5,021,691

[45] Date of Patent: Jun. 4, 1991

[54] LEVEL CONVERSION CIRCUIT HAVING CAPABILITY OF SUPPLYING OUTPUT SIGNAL WITH CONTROLLED LOGICAL LEVEL

[75] Inventor: Hitoshi Saito, Tokyo, Japan

[73] Assignee: NEC Corporation, Japan

[21] Appl. No.: 372,010

[22] Filed: Jun. 27, 1989

[30] Foreign Application Priority Data

Jun. 27, 1988 [JP] Japan .................. 63-159668

[51] Int. Cl.[5] .................. H03K 17/10; H03K 17/16; H03K 17/687; H03K 19/094
[52] U.S. Cl. .................. 307/475; 307/558; 307/559; 307/451; 307/446; 307/544
[58] Field of Search ............ 307/448, 475, 450, 451, 307/446, 457, 499, 544, 557–559, 443

[56] References Cited

U.S. PATENT DOCUMENTS

| | | | |
|---|---|---|---|
| 4,016,430 | 4/1977 | Kanezuka | 307/450 X |
| 4,071,784 | 1/1978 | Maeder et al. | 307/475 X |
| 4,096,584 | 6/1978 | Owen, III et al. | 307/450 X |
| 4,220,876 | 9/1980 | Ray | 307/559 X |
| 4,392,067 | 7/1983 | Price, Jr. | 307/559 X |
| 4,697,110 | 9/1987 | Masuda et al. | 307/475 |
| 4,698,524 | 10/1987 | Plagens | 307/475 X |
| 4,801,824 | 1/1989 | Fellinger et al. | 307/558 |
| 4,833,342 | 5/1989 | Kiryu et al. | 307/559 X |
| 4,897,565 | 1/1990 | Shimizu | 307/475 X |

Primary Examiner—Stanley D. Miller
Assistant Examiner—David R. Bertelson
Attorney, Agent, or Firm—Leydig, Voit & Mayer

[57] ABSTRACT

A level conversion circuit is disclosed in which the level conversion circuit is formed by connection a plurality of field-effect transistors (FETs) and a plurality of diodes in series between prescribed potentials, and the FETs and the diodes constituting a logical level conversion part and the FETs and the diodes constituting a current control part respectively have identical element forms.

12 Claims, 5 Drawing Sheets

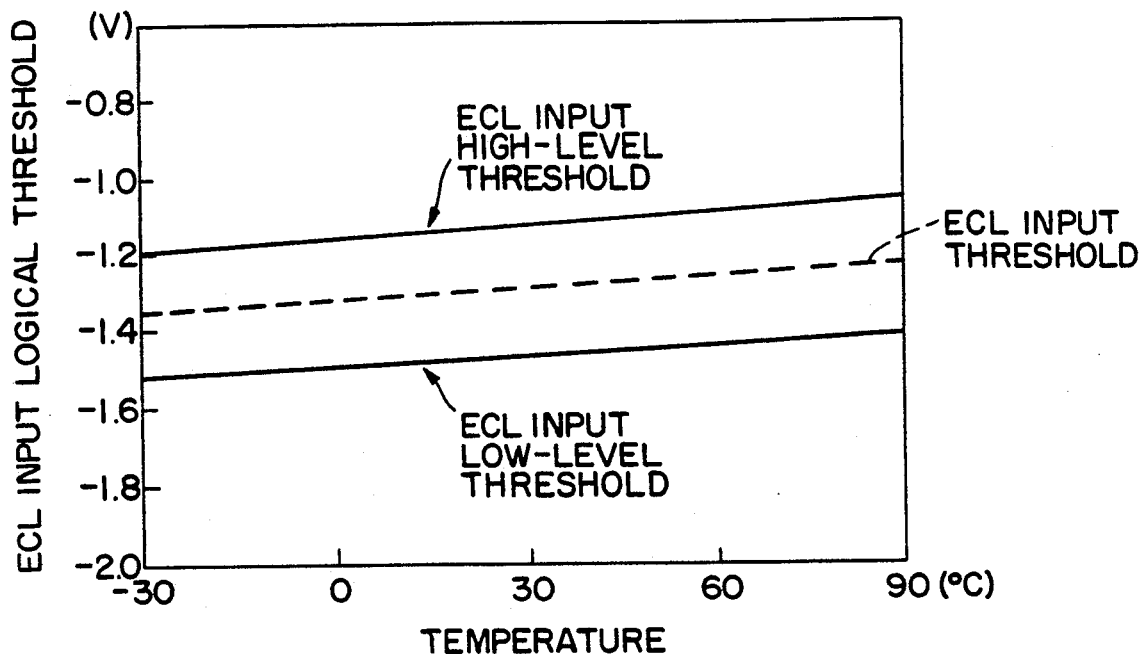
FIG. 3
FIG. 4
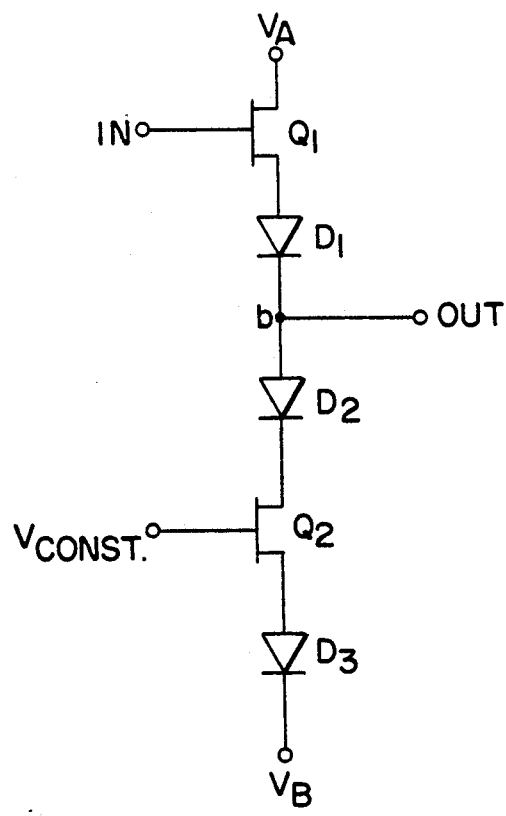

LEVEL CONVERSION CIRCUIT HAVING CAPABILITY OF SUPPLYING OUTPUT SIGNAL WITH CONTROLLED LOGICAL LEVEL

BACKGROUND OF THE INVENTION

1. Field of the Invention

The present invention relates to a level conversion circuit, and more particularly to a logical level conversion circuit for executing a conversion of an input logical level to a signal level for a logical integrated circuit formed on a gallium arsenide (GaAs) substrate.

2. Description of the Related Art

A logical integrated circuit device (GaAs IC) formed on a gallium arsenide substrate is drawing attention especially as a super-high speed device to be substituted for a silicon ECL high-speed integrated circuit device (Si-ECL IC) in view of its high-speed characteristic due to high electron mobility of gallium arsenide. In such a high-speed IC, it becomes necessary to provide a logical level conversion circuit in the input and output circuit in order to realize matching between the logical level of a GaAs IC and the logical level of a circuit connected thereto. For instance, in the case of connecting a Si-ECL IC to a circuit formed in a GaAs IC having a super-high speed characteristic, a logical level conversion from the logical level ($-0.82$ V, $-1.82$ V) of the Si-ECL IC to the logical level ($-1.6$ V, $-2.4$ V) of the logical gate in the GaAs IC is carried out in the input circuit of the GaAs IC. In the input circuit of a GaAs IC, there is required an exact level conversion with high accuracy of logical amplitude in the logical level conversion circuit for the reason that there are generated variations in the logical amplitude due to the deviation of the logical level threshold due to a manufacturing error of transistors in the input circuit.

The prior art logical level conversion circuit for carrying out logical level conversion from the Si-ECL IC to the GaAs IC has a constitution in which there are series-connected, between a high potential source and a low potential source serving as power sources for the GaAs IC, a source follower field-effect transistor (FET) applied with the input logical level of the Si-ECL IC as its gate input a level shift diode which shifts the voltage by a prescribed voltage in the forward direction, and a current source causing a prescribed current to flow between the high potential source and the low potential source. In this arrangement, a converted logical level is derived at the junction of the level shift diode and the current source. Namely, a logical level conversion part consisting of a source follower FET and a level shift diode which supply a voltage obtained by subjecting a prescribed high potential to a prescribed voltage drop and a current control part which uses a current source that causes a prescribed current flow between the high potential source and the low potential source are connected in series. The logical level of the GaAs IC is obtained from the junction of this series connection.

In such a logical level conversion circuit, a source follower FET, a level shift diode and a current source are connected in series so that the shift of an input logical level is determined by the voltage between the gate and source of the source follower FET and the forward voltage drop of the level shift diode, the forward voltage drop being determined by the value of the constant current supplied by the current source. Now, this current value varies in accordance with the fluctuations in various characteristics of the elements constituting the current source, due to dispersion in their manufacture. Moreover, the voltage between the gate and source of the source follower FET and each of the forward voltage drops of the level shift diodes vary also with the dispersion in the manufacture of each of these elements. Since, however, these variations cannot be controlled artificially, there arises an inconvenience that it is not possible to supply an input signal with rigorously set logical level to the GaAs IC. In an integrated circuit device for high-speed operation such as the GaAs IC, margins of the threshold values have to be set in general to small values so that there exists a drawback in that the operational characteristics of the integrated circuit are deteriorated by the variations in the logical level of the input from the logical level conversion circuit.

SUMMARY OF THE INVENTION

In accordance with the present invention, there is obtained a level conversion circuit which includes a logical level conversion part formed by serially connecting at least one diode to the source electrode of a first FET having its gate electrode as an input terminal, and a current control part formed by a second FET and diodes with identical element forms and circuit constructions to those of the logical level conversion part and which supplies a reference voltage to the gate electrode of the second FET, and these parts are connected in series between a first and a second power source, thereby outputting an output logical level from the junction part of the logical level conversion part and the current control part.

With a constitution as in the above, transistors and diodes used for the logical level conversion part and for the current control part have respectively identical element forms and circuit constructions so that dispersions of the various characteristics due to differences in the manufacturing conditions between transistors and diodes become equal for both of the logical level conversion part and the current control part. As a result, a level shift which is set in the logical level conversion part will become always equal to the reference voltage that is supplied to the current control part regardless of the current that is passed between the high potential source and the low potential source. By supplying the reference voltage from a constant voltage source, the level shift can be determined uniquely without being affected by the element characteristics and the like. Therefore, setting of an exact logical threshold becomes feasible, and hence deterioration in the input characteristic of an integrated circuit having high-speed operational characteristics, such as GaAs IC, can be securely prevented.

BRIEF DESCRIPTION OF THE DRAWINGS

The aforementioned objects, features and advantages of the present invention will become more apparent from the following detailed description taken in conjunction with the accompanying drawings, wherein:

FIG. 3 is a diagram showing the temperature dependence of the logical threshold level for the prior art ECL IC;

FIG. 4 is a circuit diagram showing an embodiment of the logical level conversion circuit of the present invention;

Figure 1:
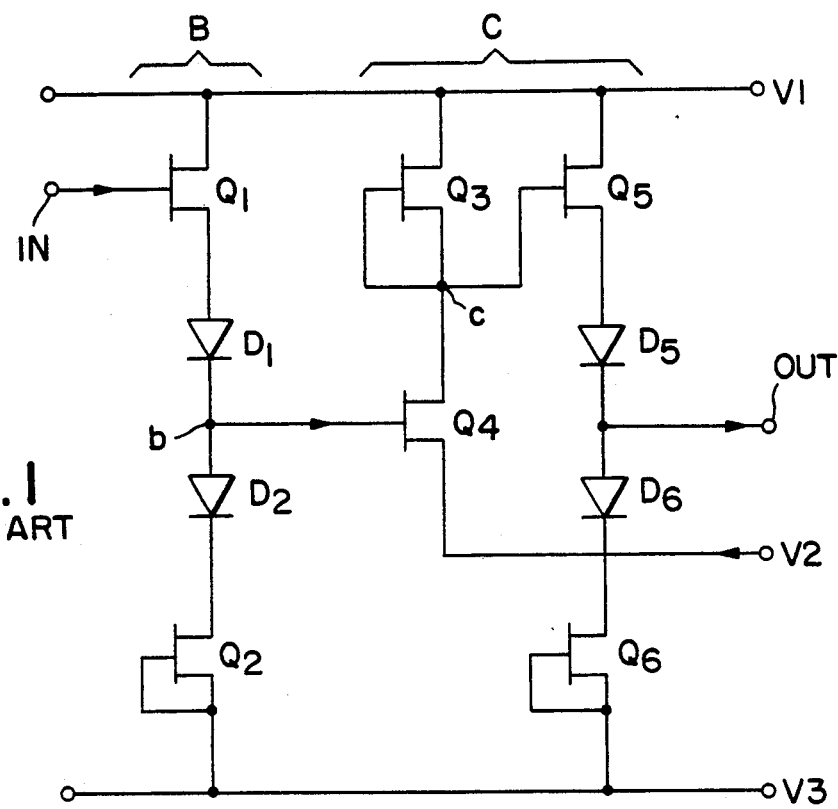
FIG. 1 is a circuit diagram showing an example of an input circuit having the prior art logical level conversion circuit.
Figure 2:
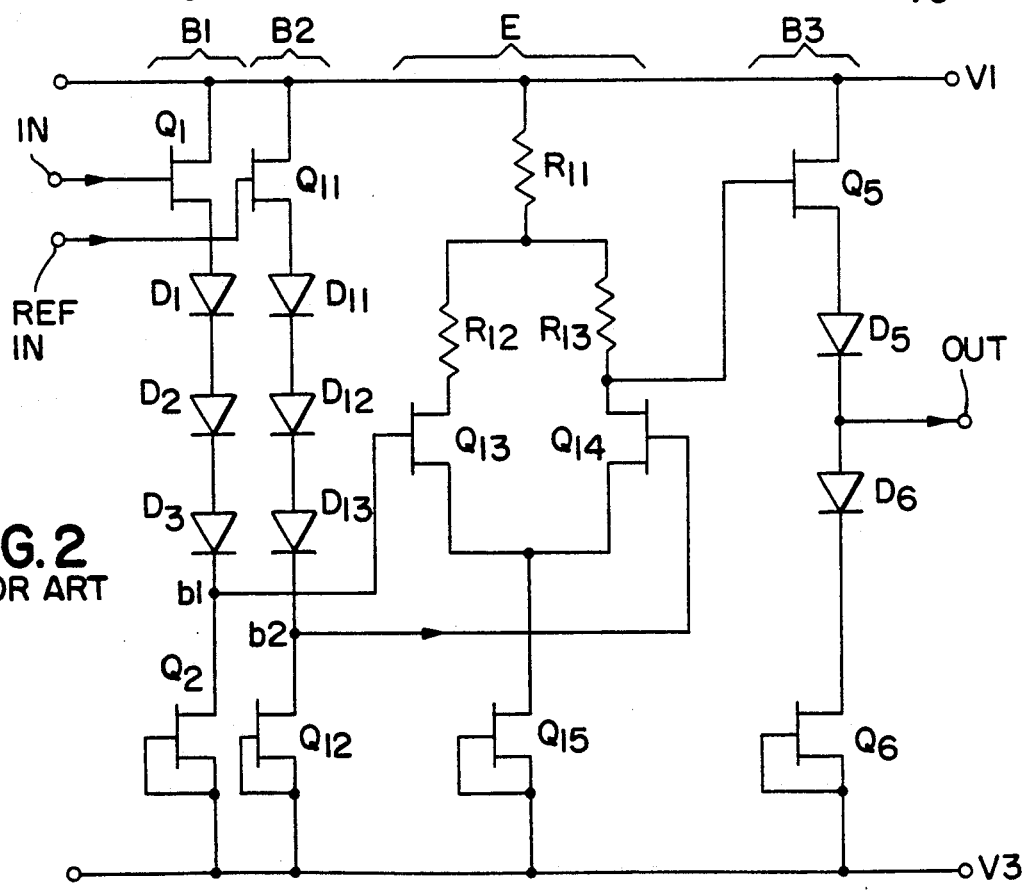
FIG. 2 is a circuit diagram showing another example of an input circuit having the prior art logical level conversion circuit.

Input circuits having prior art logical level conversion circuit are shown in FIG. 1 and FIG. 2.

The input circuit shown in FIG. 1 is composed of a logical level conversion circuit B which converts a logical level of an input from a level used in a Si-ECL IC to a prescribed level, and a buffered FET logic (BFL) invertor circuit C which supplies a converted input logical signal having a level suited for using in a GaAs IC. The logical level conversion circuit B is formed by connecting in series a source follower FET $Q_1$ having gate electrode connected to an input terminal IN for receiving an input level from the Si-ECL IC a current source FET $Q_2$ having a gate electrode connected to the source terminal, and level shift diodes $D_1$ and $D_2$ for producing a prescribed voltage drop. The BFL inverter circuit C consists of a series connection part formed of a load FET $Q_3$ having gate and source electrodes connected each other and a driver FET $Q_4$ having a gate electrode connected to the junction "b" of the level shift diodes $D_1$ and $D_2$ in the logical level conversion circuit B, and a series connection part formed of a source follower FET $Q_5$ having a gate electrode connected to the junction "c" of the FETs $Q_3$ and $Q_4$ in the above-mentioned series connection part, a current source FET $Q_6$ having a gate electrode connected to its own source terminal, and level shift diodes $D_5$ and $D_6$ producing a prescribed voltage drop in the electrical path between the two FETs $Q_5$ and $Q_6$. An input logical level to the GaAs IC is taken out from the junction of the diodes $D_5$ and $D_6$.

In a circuit with the above constitution, in the logical level conversion circuit B, a constant current is supplied from the current source FET $Q_2$ to the source follower FET $Q_1$ and the level shift diodes $D_1$ and $D_2$. A logical level with a level converted from a logical level applied to the input terminal IN is given to the junction "b". Namely, since the FET $Q_1$ works as a source follower, the potential $V_{GS}$ between the gate and the source electrodes will be zero volt as long as the FET $Q_1$ operates within the ideal saturated region. Due to this fact, the potential given to the junction "b" will have a value which is the input logical level dropped by the forward voltage $V_f$ of the level shift diode $D_1$. Here, the forward voltage $V_f$ of the level shift diode $D_1$ is changed in accordance with the current value which is supplied from the current source FET $Q_2$.

In FIG. 2, is shown another prior art input circuit consisting of a first logical level conversion circuit B1 which converts an input logical level to a prescribed logical level, a second logical level conversion circuit B2 which generates a prescribed reference voltage from a logical threshold reference voltage, a resistance load type differential circuit E receiving logical levels obtained from the first and the second logical level conversion circuits B1 and B2 as its inputs, and a third logical level conversion circuit B3 which converts a potential obtained from the differential circuit E to a prescribed logical level to be input to the circuit in the GaAs IC.

The basic constitution of the first, second and third logical level conversion circuits B1, B2 and B3, respectively, is similar to that of the logical level conversion circuit B shown in FIG. 1. A logical level of an input signal is applied, to a source follower FET $Q_1$ in the first logical level conversion circuit B1 through an input terminal IN and a reference voltage level is given to a source follower FET $Q_{11}$ in the second logical level conversion circuit B2 through a terminal REF IN. Those levels are converted to be supplied to the differential circuit E through the junctions "$b_1$" and "$b_2$". The output potential of the differential circuit E is given to an FET $Q_5$ in the third logical level conversion circuit B3. In the logical level conversion circuits B1, B2 and B3, prescribed currents are supplied from the current source FETs $Q_2$, $Q_{12}$ and $Q_6$, respectively. The logical levels of the applied signal are subjected to a level shift by a voltage drop induced by respective level shift diodes $D_1$, $D_2$, $D_3$; $D_{11}$, $D_{12}$, $D_{13}$; and $D_5$, to be output from the junctions "$b_1$" and "$b_2$" and an output terminal OUT. In the differential circuit E, the FETs $Q_{13}$ and $Q_{14}$ are connected in parallel a current source FET $Q_{15}$ is connected to the common source junction of the FETs $Q_{13}$ and $Q_{14}$, and load resistors $R_{12}$ and $R_{13}$ are connected to the drain electrodes of the FETs $Q_{13}$ and $Q_{14}$, respectively. The junction of the other ends of the load resistors $R_{12}$ and $R_{13}$ is connected via a level adjusting resistor $R_{11}$ to a power source terminal V1. The junction of the load resistor $R_{13}$ and the FET $Q_{14}$ is connected to the gate electrode of the source follower FET $Q_5$ in the third logical level conversion circuit B3.

In the input circuit shown in FIG. 2 consisting of logical level conversion circuits and a resistance load type differential circuit, the logical threshold will be determined by the reference voltage REF IN provided that the current-voltage characteristics of the level shift diodes $D_1$-$D_3$ and $D_{11}$-$D_{13}$ vary uniformly in accordance to the temperature and element characteristics since the output logical level is switched depending upon the relative magnitude of the gate-source voltages of the FETs $Q_{13}$ and $Q_{14}$.

In the input circuit shown in FIG. 1, the current-voltage ($I_f$-$V_f$) characteristic of the level-shift diodes $D_1$ and $D_2$ has a temperature dependence of about $-1$ mV/°C. so that the potential at the junction "b" varies, resulting in a variation in the logical level at the output terminal OUT. Further, since variations are induced in the forward voltage $V_f$ itself of the diodes $D_1$ and $D_2$ and the threshold voltage $V_t$ itself of the FETs $Q_1$ and $Q_2$ due to variation in the manufacturing condition, another fluctuations in the output logical level is caused by the above-mentioned variation in the manufacturing condition.

Further, in the circuit shown in FIG. 2, there are drawbacks in that a sufficient gain cannot be secured when the resistance load type differential circuit consisting of the FETs $Q_{13}$ and $Q_{14}$ is operated at a high speed of almost several gigahertzs, reducing the degree of amplification, and moreover, the logical level that is determined by the level adjusting resistors $R_{11}$–$R_{13}$ varies due to variations in the drain current caused by the variations in the threshold voltage $V_t$ of the current source FET $Q_{15}$.

Further, when there performs a interface between the Si ECL IC and the GaAs IC, there are drawbacks which will be described below. In FIG. 3, an input threshold Vth varies linearly due to variation in the environmental temperature. The variation $\Delta$Vth is about $+1.3$ mV/°C. In a case where GaAs IC and ECL IC are connected and GaAs IC operates in a super high-speed in a condition used with ECL IC and GaAs IC together in the system, it is important that the variation of the level shift due to variations of the threshold Vt in the FETs and variations of the forward voltage $V_f$ is compensated, and that the variation of an input threshold in ECL IC is compensated, for operating stably.

DESCRIPTION OF THE PREFERRED EMBODIMENTS OF THE INVENTION

Referring to the drawings, the present invention will be described next.

FIG. 4 is a circuit diagram showing an embodiment of the present invention. The basic constitution of the present invention is such that a logical level conversion part for converting an input logical level to a prescribed logical level and a current control part supplying a prescribed current to the logical level conversion part are connected in series between a first power terminal $V_A$ and a second power terminal $V_B$, an output terminal OUT being derived from the junction "b" of the series connection. The logical level conversion part consists of a source follower FET $Q_1$ whose gate electrode is connected to an input terminal IN to which an input logical is applied from outside, and a level-shift diode $D_1$ connected to the source electrode of the FET $Q_1$. The current control part is constructed using FETs and diodes that have identical element forms in size and impurity concentration and other physical conditions and circuit constructions. That is, the current source FET $Q_2$ is formed by the manufacturing processes and the element size (gate width) identical to those of the source follower FET $Q_1$, and a dummy level shift diode $D_3$ is formed by the manufacturing processes and the element size (anode area) identical to those of the level shift diode $D_1$. In addition, these FETs and diodes are similarly circuited so that the respective diode is connected to the source side of the respective FET. A constant potential is given to the gate electrode of the current source FET $Q_2$ to produce a prescribed drain current. The diode $D_2$ is an adjusting diode for canceling the difference between the voltage given to the junction "b" by the logical level conversion part and the voltage given to the drain of the current source FET of the current control part. Namely, the diode $D_2$ functions to make the voltage generated between the FET $Q_1$ and the diode $D_1$ equal to that generated between the FET $Q_2$ and the diode $D_3$.

With a circuit constitution as in the above, the source follower FET $Q_1$ of the logical level conversion part and the FET $Q_2$ of the current control part are formed so as to possess identical element characteristics since they are formed by identical manufacturing processes, so that the potential differences $V_{GS}$ generated between the gate electrode and the source electrode of the respective FETs $Q_1$ and $Q_2$ become equal so long as the FETs $Q_1$ and $Q_2$ operate in their saturated regions. Analogously, the diodes $D_1$ and $D_3$ possess identical element characteristics since they are formed by identical manufacturing processes, so that the forward voltage $V_f$ of the respective diodes will be equal and there will be no dispersion among the elements so long as a constant current is made to flow between the power terminals $V_A$ and $V_B$. Now, potential $V_b$ given to the junction "b" is equal to a voltage lower than the logical level $V_{IN}$ by the sum of voltages of the potential difference $V_{GS}$ between the gate and the source electrodes of the FET $Q_1$ and the forward voltage $V_f$ of the diode $D_1$, (namely, $V_b = V_{IN} - (V_{GS} + V_f)$). Since the FETs and the diodes used in the logical level conversion part and the current control part possess identical element characteristics, as mentioned earlier, there will be generated a potential difference between the gate potential of the FET $Q_2$ in the current control part and the potential of the power terminal $V_B$ which is equal to the voltage drop $(V_{GS} + V_f)$ generated in the logical level conversion part, if it is assumed that a prescribed current flows between the power terminals $V_A$ and $V_B$ and the FETs operate in their saturated regions. The potential difference between the gate potential of the FET $Q_2$ and the potential of the power terminal $V_B$ corresponds to the potential difference between the voltage $V_{const.}$ given to the constant potential supply terminal and the potential of the power terminal $V_B$, so that the potential given to the junction "b" is determined uniquely by the constant voltage $V_{const.}$ given to the constant voltage supply terminal.

In other words, in the present logical level conversion circuit, the FETs and the diodes forming the logical level conversion part and the current control part are respectively formed so as to have identical forms and identical element characteristics, so that it is possible to suppress the nonuniformity in manufacturing processes and variations in element characteristics such as the temperature characteristic. Therefore, it is possible to precisely set the input logical threshold to the circuit in a GaAs IC with respect also to the variations in the threshold voltage $V_t$ of the FET and the variations in the forward voltage of the diode.

As described in the above, in the logical level conversion circuit of the present invention, it is possible to suppress the influence of variation in the element characteristics on the shift of the input logical level, and to supply an exact logical threshold by giving a construction to the circuit which enables to set the shift uniquely with a prescribed supply voltage. Therefore, the diode for level shift may be replaced by a plurality of diodes connected in series, and the voltage adjusting diode provided between the logical level conversion part and the current control part may be replaced by a plurality of diodes connected in series.

Figure 5:
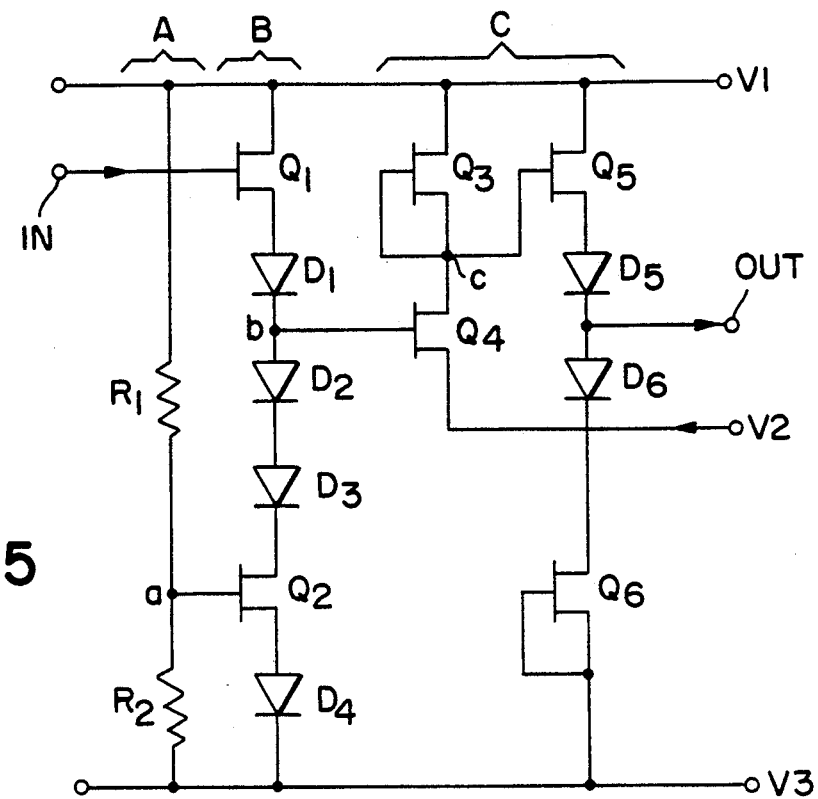
FIG. 5 is a circuit diagram showing an embodiment of input circuit using the logical level conversion circuit of the present invention.

In FIG. 5 is shown an input circuit using an embodiment of the logical level conversion circuit of the present invention.

The input circuit has an input terminal IN, an output terminal OUT and power terminals $V_1$, $V_2$ and $V_3$, and is composed of a reference voltage generating circuit A, a logical level conversion circuit B and a BFL inverter circuit C. The reference voltage generating circuit A of the present embodiment consists of a first resistor $R_1$ and a second resistor $R_2$ connected in series between a power terminal $V_1$ for supplying a high potential of power voltage and a power terminal $V_3$ for supplying a low potential of the power voltage. The junction "a" of the resistors $R_1$ and $R_2$ serves as a reference voltage output point. The logical level conversion circuit B is constructed by a series connection, between the power terminals $V_1$ and $V_3$, of a logical level conversion part having a series connection of a source follower FET $Q_1$ whose gate electrode connected to the input terminal IN and a level shift diode $D_1$, a current control part having a series connection of a current source FET $Q_2$ whose gate electrode is connected to the output point "a" of the reference voltage generating circuit A and a dummy level shift diode $D_4$, and a series connection of adjusting diodes $D_2$ and $D_3$ for setting the voltage between the drain and source of the FET $Q_1$ and $Q_2$ to be equal. It is to be noted here that the channel widths of the FETs $Q_1$ and $Q_2$ and the anode areas of the diodes $D_1$ and $D_4$ are set to be identical. That is to say, the FETs $Q_1$ and $Q_2$ and the diodes $D_1$ and $D_4$ are respectively formed to have identical element characteristics.

In the input circuit of the present embodiment, use is made of a basic constitution shown in FIG. 3 for the logical level conversion circuit B. The reference voltage given to the FET $Q_2$ of the current control part in the logical level conversion circuit B, namely, the voltage corresponding to the level shift of the logical level conversion circuit B, is supplied from the junction "a" the voltage at which is determined by the ratio of the resistances of the resistors $R_1$ and $R_2$. For this reason, the variations in the logical level at the output junction "b" of the logical level conversion circuit B can be suppressed to a very low level, so that it is possible to supply an exact logical threshold to the BFL inverter circuit C.

Here, it is assumed that the supply voltages are $V_1=0$ V, $V_2=-2.0$ V and $V_3=-5.2$ V, the logical threshold of logical signal applied to the input terminal IN is $-1.32$ V and the logical threshold of the FET $Q_5$ of the BFL inverter circuit C is $-1.0$ V. In this case, it is assumed further that the ratio of the channel widths of the FETs $Q_3$ and $Q_4$ is 1:1, then the logical threshold voltage of the input stage of the BFL inverter circuit C can be set to $-2.0$ V which is the same value as that of the power terminal $V_2$ by arranging so as to obtain 0 V for the voltage $V_{GS}$ between the gate and the source electrodes of the FET $Q_4$ since the $V_{GS}$ of the FET $Q_3$ is 0 V. This means that there is required a level shift of $-1.32-(-2.0)=0.68$ V, between the ECL logical threshold voltage $-1.32$ V applied to the input terminal IN and the logical threshold voltage $V_2$. When a reference voltage is applied by the reference voltage generating circuit A between the gate electrode of the FET $Q_2$ and the power terminal $V_3$, by considering the fact that the current flowing through the current control part of the FET $Q_2$ and the diode $D_4$ is equal to the current flowing through the logical level conversion part consisting of the FET $Q_1$ and the diode $D_1$, it becomes possible by supplying a reference voltage of 0.68 V to the gate electrode of the FET $Q_2$ by setting the resistors $R_1$ and $R_2$ in the reference voltage generating circuit A to the resistance ratio of 4.52:0.68, to obtain an exact logical threshold without being affected by the variations with the manufacturing dispersions in the threshold voltage $V_t$ of the FETs and the temperature dependences in the forward voltage $V_f$ of the diodes.

Since the logical threshold of the FET $Q_5$ in the BFL inverter circuit C is set to $-1.0$ V here, it has been arranged to output a potential of $-2.0$ V at the junction "b" by setting the gate width ratio of the FETs $Q_3$ and $Q_4$ to be 1:1. When the value of the logical threshold of the FET $Q_5$ is set to another value, the channel width ratio of the FETs $Q_3$ and $Q_4$ and the potential to be output at the junction "b" need only be set accordingly. Even for such a case, it is possible in accordance with the present invention to obtain easily an exact potential for the junction "b" by setting the resistance ratio of the resistors $R_1$ and $R_2$ of the reference voltage generating circuit A appropriately.

Figure 6:
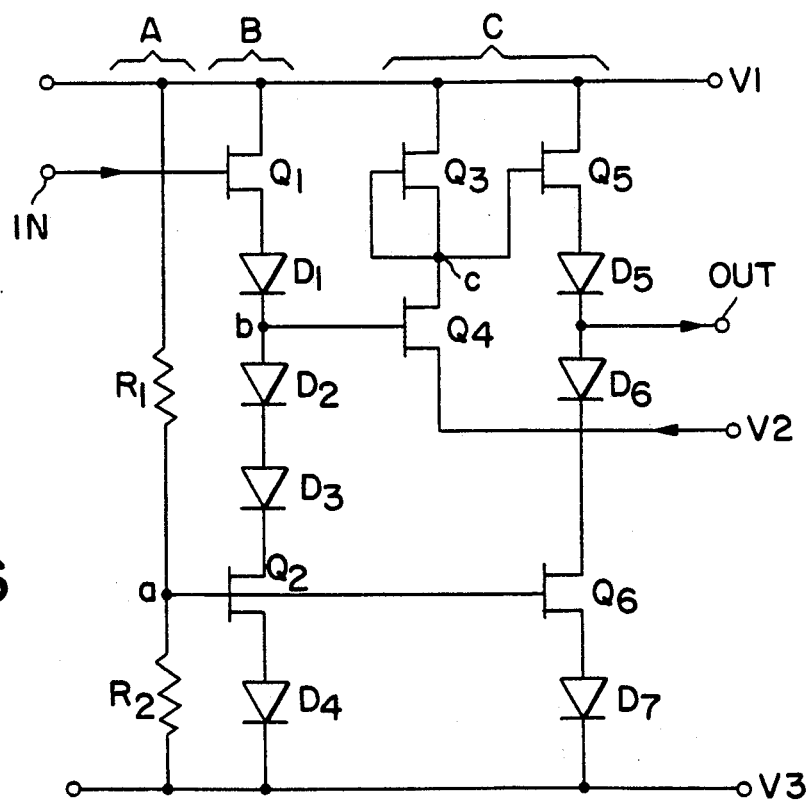
FIG. 6 is a circuit diagram showing another embodiment of input circuit using the logical level conversion circuit of the present invention.

FIG. 6 is a circuit diagram for another embodiment of the present invention. In the case of low speed operation below several gigahertz, the degree of amplification of the BFL inverter circuit C and the amplitude of the output at the output terminal OUT are large so that the variations in the forward voltage $V_f$ of the level shift diode $D_5$ in the BFL inverter circuit C will not be important. However, when the speed of operation becomes a high value of greater than several gigahertz, the degree of amplification of the BFL inverters will be decreased such that, with a single stage of BFL, the output amplitude becomes low and its waveform shaping capability becomes diminished. However, because of the nonuniformity of the element characteristics due to variations of manufacturing conditions, temperature characteristics and the like, mainly the forward voltage $V_f$ of the level shift diode in the BFL inverter circuit C undergoes variations, as mentioned before, inducing variations in the logical level to be input to the GaAs IC. This, in turn, introduces a deviation from the logical threshold of the inverter or the like in the next stage in the input circuit, causing sometimes a nonoperation of the next stage and thereafter. In this another embodiment, circuit constitution similar to that of the logical level conversion part of the logical level conversion circuit B is introduced also to the logical level conversion part, namely, a FET $Q_5$ and a diode $D_5$ in the BFL inverter circuit C, and a FET $Q_6$ and a diode $D_7$ having identical element characteristics to the FET $Q_5$ and the diode $D_5$, respectively, are used to correct the variations in the level shift diode $D_5$ to control the logical level to be supplied to the output terminal OUT.

Figure 7:
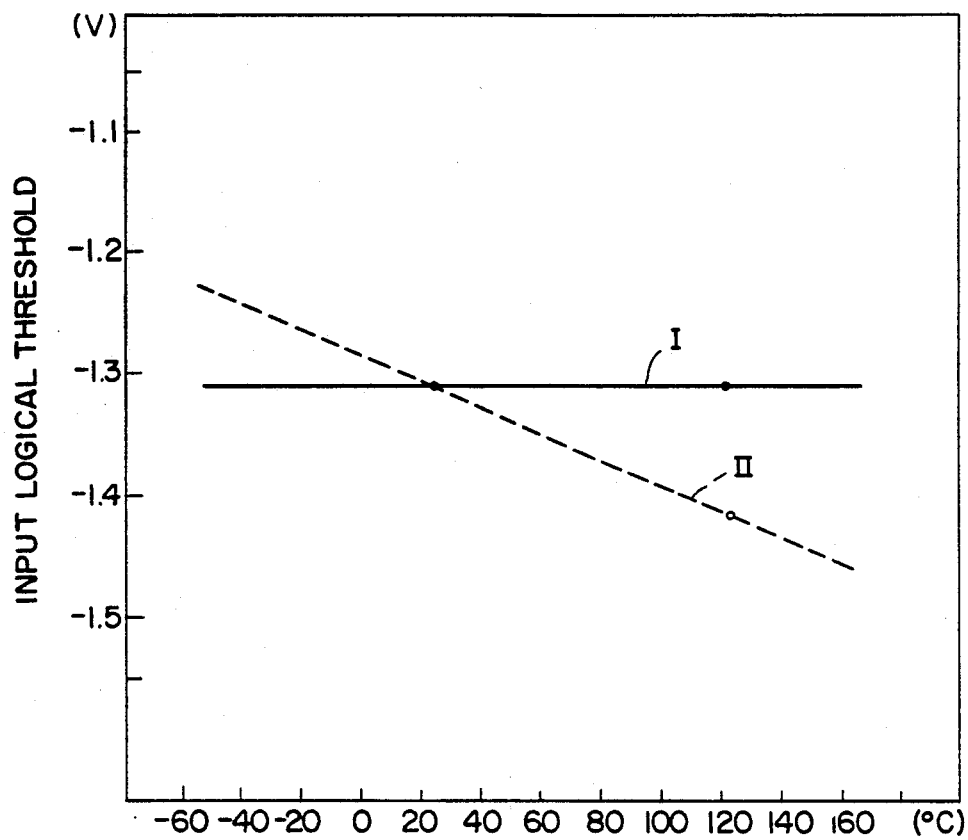
FIG. 7 is a diagram showing the temperature dependence of the input logical threshold for the input circuit of the present invention shown in FIG. 5 and for the input circuit of the prior art as shown in FIG. 1.

FIG. 7 is a temperature dependence diagram showing the result of the temperature dependence simulation of the input logical threshold for the input circuit of the present invention shown in FIG. 5 and the prior art input circuit shown in FIG. 1. The curve II of the prior art input circuit shows variations in the input logical threshold due to temperature dependency of the individual level shift diode in the input circuit. In contrast, in the input circuit of the present embodiment the curve I reveals little variation as a result of suppression of the nonuniformity in the manufacturing processes and the variations in the element characteristics.

The resistance division technique has been adopted for the reference voltage generating circuit in the present invention. However, it should be noted that use may also be made of a more general type of the reference voltage generating circuit. Further, the case of level conversion circuit with a Si-ECL has been taken up for illustration purposes, but the present invention is applicable, needless to say, also to any other arbitrary case of level conversion.

Figure 8:
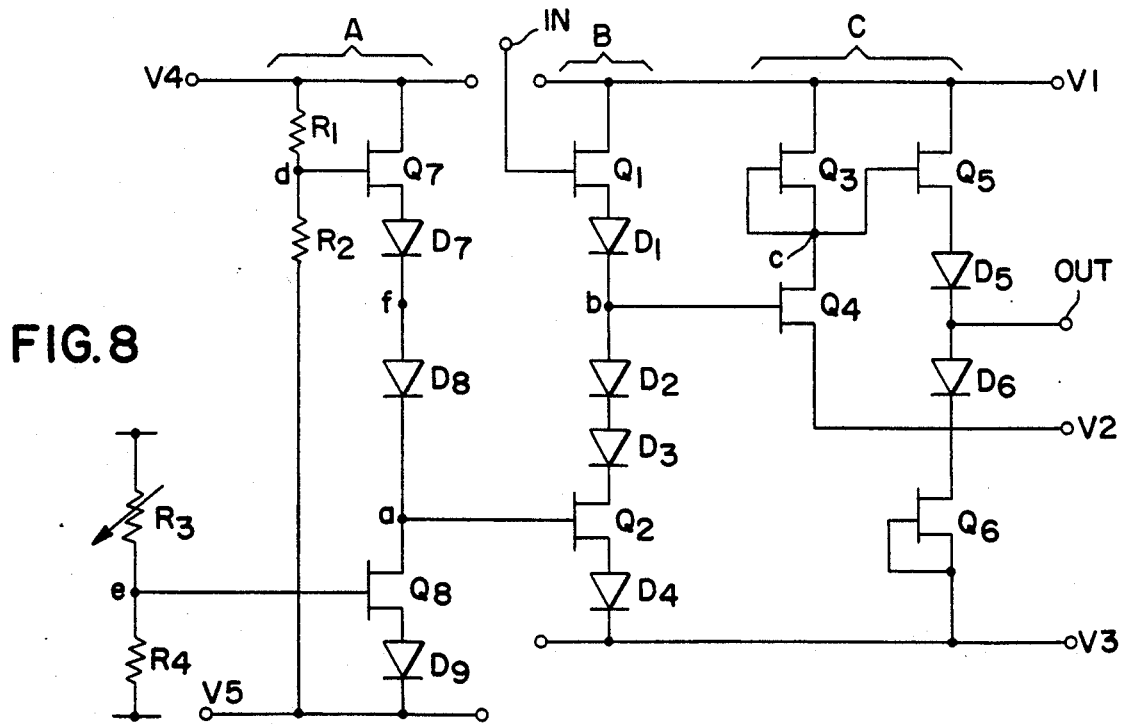
FIG. 8 is a circuit diagram showing an embodiment of reference voltage generating circuit using the logical level conversion circuit of the present invention.

FIG. 8 shows an embodiment of a reference voltage generating circuit using the logical level conversion circuit of the present invention for compensating the temperature characteristic.

The reference voltage generating circuit A consists of a constant voltage supply circuit of resistors $R_1$ and $R_2$ and a logical level supply circuit constituted of FETs $Q_7$ and $Q_8$ and diodes $D_7$ and $D_8$. These circuits are connected in parallel between power terminals $V_4$ and $V_5$. The gate electrode of the FET $Q_7$ is connected to a junction "d" for receiving a constant voltage determined by resistor division ratio of resistors $R_1$ and $R_2$. The gate electrode of the FET $Q_8$ is connected to an external controlled voltage adjusting terminal "e". A prescribed voltage is supplied to the external controlled voltage adjusting terminal "e" by, for example, resistors $R_3$ and $R_4$ connected in series between power lines supplying an adjusting voltage. The channel widths of the FETs $Q_7$ and $Q_8$ and the anode areas of the diodes $D_7$ and $D_9$ are set identically, respectively. Therefore, the same drain current flows through the FETs $Q_7$ and $Q_8$, so that the voltage $V_{GS7}$ between the gate and source electrodes of the FET $Q_7$ becomes equal to the voltage $V_{GS8}$ of the FET $Q_8$. The same current flows also through the diodes $D_7$ and $D_9$, so that the voltage $V_{f7}$ between the anode and cathode of the diode $D_7$ becomes equal to the voltage $V_{f9}$ of the diode $D_9$.

Figure 9:
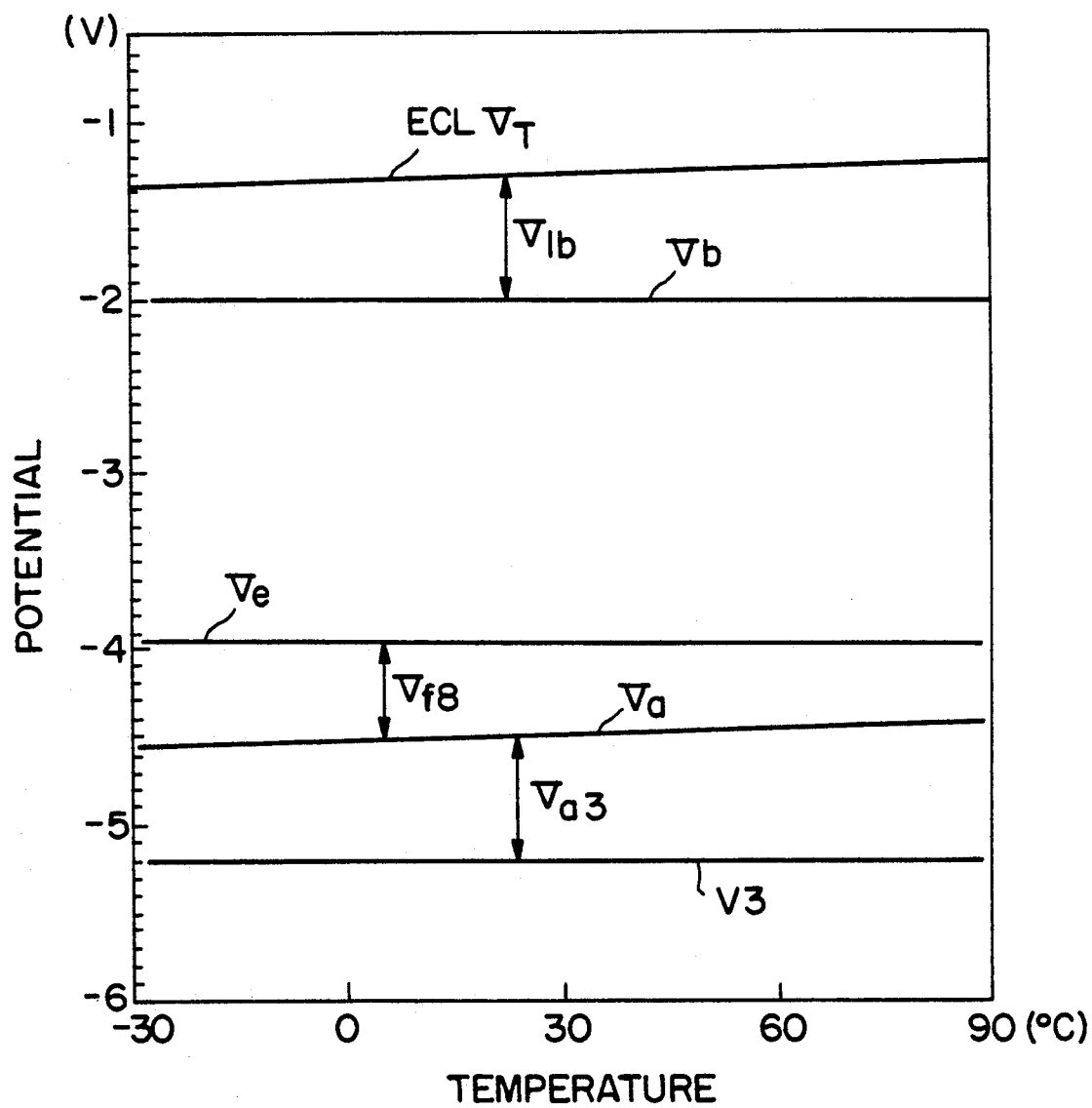
FIG. 9 is a diagram showing the potential variations with temperature of each junction for the logical level conversion circuit of the present invention as shown in FIG. 6.

The element characteristics of the FETs $Q_7$ and $Q_8$ and the diodes $D_7$ and $D_9$ is similarly varied respectively in accordance to the operating temperature, so that the voltages $V_{GS7}$ and $V_{GS8}$ and the voltages $V_{f7}$ and $V_{f9}$ are kept same, respectively. The potential difference $V_{df}$ between the gate electrode of the FET $Q_7$ and the junction "f" of the diodes $D_7$ and $D_8$ is the sum of the voltage $V_{GS7}$ between the gate and source electrode of FET $Q_7$ and the forward voltage $V_{f7}$ of the diode $D_7$. The voltage difference $V_{e5}$ between the gate electrode of the FET $Q_8$ and the power terminal $V_5$ is the sum of the voltage $V_{GS8}$ between the gate and source electrodes of the FET $Q_8$ and the forward voltage $V_{f9}$ of the diode $D_9$. Here, both potential differences $V_{df}$ and $V_{e5}$ are equal in the present invention. Therefore, when the gate potential of the FET $Q_8$ is constant voltage, the potential of the junction "e" is determined exclusively by the power voltages $V_4$ and $V_5$ and the resistors $R_1$ and $R_2$ or the voltage $V_e$ supplied to the external adjusting terminal "e" without being affected by the temperature dependences of the FETs and diodes. The potential $V_a$ at the junction "a" in the reference voltage generating circuit A is determined by the potential $V_e$ at the junction "e" and the forward voltage $V_{f8}$ of the diode $D_8$. The forward voltage variation $\Delta V_f$ of the diodes varies at about a rate $-1.2$ mV/°C. as shown in FIG. 9. Therefore, the junction "a" is the output terminal of the reference voltage generating circuit A, so that the temperature dependence of the output voltage is diminished at the rate about $-1.2$ mV/°C. by the temperature dependence of the forward voltage $V_{f8}$ of the diode $D_8$, the output voltage being free from the temperature dependence of the FETs $Q_7$ and $Q_8$ and the diodes $D_7$ and $D_9$.

As described above, the potential difference $V_{1b}$ between the gate electrode of the FET $Q_1$ and the junction "b" is equal to the potential difference $V_{a3}$ between the gate electrode of the FET $Q_2$ and the power terminal $V_3$, so that the logical level of the input signal is shifted by the variation of the forward voltage $V_{f8}$ of the diode $D_8$ in the reference voltage $V_a$ generating circuit A. Therefore, this variation is matched to the variation of the input logical level in the ECL IC as shown in FIG. 9. In addition, the logical level in GaAs IC is determined by the potential of the power terminal $V_5$ without affected by the temperature variation.

The potential $V_b$ at the junction "b" varies with the temperature dependence of the rate $+1.3$ mV/°C. of the ECL logical threshold voltage $V_T$ and the temperature dependency of the rate $+1.2$ mV/°C. of the diode $D_8$, so that the potential $V_b$ at the junction "b" is always kept to have a value equal to the logical threshold $V_t$ in GaAs IC.

In the present embodiment, it is possible to suppress variation in the threshold and the forward voltage with the temperature, if the potential of the power terminals $V_4$ and $V_5$ and the value of the resistors $R_1$ and $R_2$ are selected as above-mentioned and the voltage at the external adjusting terminal "e" is set to the suitable value by an initial adjustment, it is unnecessary to adjust the circuit.

As has been described in the foregoing, the input circuit of the present invention will not give rise to variations in the logical level to be given to an internal circuit due to variations of the current-voltage (I-V) characteristic of the diode and variations of the threshold voltage $V_t$ of the FET. Therefore, when applied to the input circuit for a GaAs IC, it will exactly control the input signal level, and will be effective for improving the yield and the high frequency characteristic of the circuit. It will be especially effective in an input circuit required to be operated at a high speed of more than several gigahertz.

What is claimed is:

1. A level conversion circuit comprising a logical level conversion part formed by connecting in series at least one diode to a source electrode of a first field-effect transistor having its gate electrode as an input terminal for receiving an input signal to be level-converted, and a current control part formed by connecting in series a second field-effect transistor and at least one diode having element forms identical to those of said logical level conversion part, the gate electrode of said second field-effect transistor receiving a reference voltage, wherein an output terminal is connected to a first power source via said logical level conversion part and is connected to a second power source via said current control part.

2. A level conversion circuit as claimed in claim 1, wherein said first power source is a high potential power source and said second power source is a low potential power source.

3. A level conversion circuit as claimed in claim 1, wherein said first power source is a low potential power source and said second power source is a high potential power source.

4. A level conversion circuit as claimed in claim 1, wherein the reference voltage supplied to the gate electrode of said second field-effect transistor is a divided voltage at a junction of a plurality of resistors connected in series between said first and second power sources.

5. A level conversion circuit as claimed in claim 1, further comprising a reference voltage source including a plurality of resistors connected in series between a third power source and a fourth power source, a third field-effect transistor having a gate electrode connected to the junction of said plural resistors and a drain electrode connected to said third power source, at least first and second diodes connected in series, the first diode being connected to the source electrode of said third field-effect transistor, a fourth field-effect transistor having a gate electrode connected to an external adjusting power terminal and supplied with another reference voltage from said external adjusting power terminal, a drain electrode connected to the source electrode of said third field-effect transistor via the series connection of said first and second diodes, and an element form identical to said third field-effect transistor, and another diode connected between the source electrode of said fourth field-effect transistor and said fourth power source and having an element form identical to said first diode, wherein said reference voltage supplied to said second field-effect transistor is a voltage supplied to the drain of the fourth field-effect transistor.

6. A level conversion circuit comprising:
reference voltage supply means connected between a first power source and a second power source for supplying a prescribed potential between the potentials of said first and second power sources;
logical level conversion means connected between said first power source and an output terminal for supplying an input logical level to said output terminal by converting it to a prescribed output logical level; and
current control means connected between said output terminal and said second power source for establishing a current flow between said first and second power sources via said logical level conversion means and in response to a prescribed potential supplied by said reference voltage supply means, said current control means including element forms and circuit constructions that are identical to those of said logical level conversion means.

7. A level conversion circuit as claimed in claim 6, wherein said reference voltage supply means includes a series connection of a plurality of resistors.

8. A level conversion circuit comprising:
logical level conversion means connected between a first power source and an output terminal for supplying an input logical level to said output terminal by converting it to a prescribed output logical level;
current control means connected between said output terminal and a second power source for establishing a current flow between said first and second power sources via said logical level conversion means and in response to a prescribed potential, said current control means including element forms and circuit constructions that are identical to those of said logical level conversion means; and
reference voltage supply means for supplying said prescribed potential to said current control means, said reference voltage supply means comprising a plurality of resistors connected in series between a third power source and a fourth power source, a first field-effect transistor having a gate electrode connected to the junction of said plural resistors and a drain electrode connected to said third power source, at least first and second diodes connected in series, the first diode being connected to the source electrode of said first field-effect transistor, a second field-effect transistor having a gate electrode connected to an external adjusting power terminal and supplied with a reference voltage from said external adjusting power terminal, a drain electrode connected to the source electrode of said first field-effect transistor via the series connection of said first and second diodes and connected to a prescribed potential supplying terminal, and an element form identical to said first field-effect transistor, and a diode connected between the source electrode of said second field-effect transistor and said fourth power source and having an element form identical to said first diode, wherein said prescribed potential is supplied to said current control means is a voltage in accordance with a voltage at said prescribed potential supplying terminal.

9. A level conversion circuit as claimed in claim 6, wherein said logical level conversion means includes a field-effect transistor whose gate electrode receives said input logical level, whose source terminal is connected via at least one diode to said output terminal and whose drain terminal is connected to said first power source, and wherein said current control means includes a field-effect transistor whose gate electrode receives the prescribed potential from said reference voltage supply means, whose source terminal is connected via at least one diode to said second power source and whose drain terminal is connected to said output terminal.

10. A level conversion circuit as claimed in claim 6, wherein said first power source is a high potential power source and said second power source is a low potential power source.

11. A level conversion circuit as claimed in claim 6, further comprising a voltage adjusting means including at least one diode provided between said output terminal and said current control means.

12. A level conversion circuit as claimed in claim 6, wherein said field-effect transistor and said at least one diode of said logical level conversion means and said field-effect transistor and said at least one diode of said current control means respectively have identical element forms.

* * * * *